United States Patent
Takahira et al.

[11] Patent Number: 5,952,713
[45] Date of Patent: Sep. 14, 1999

[54] NON-CONTACT TYPE IC CARD

[76] Inventors: Kenichi Takahira; Jun Ohbuchi; Yasuhiro Murasawa, all of c/o Mitsubishi Denki Kabushiki Kaisha, 2-3, Marunouchi 2-chome, Chiyoda-ku, Tokyo 100, Japan

[21] Appl. No.: 08/577,541

[22] Filed: Dec. 22, 1995

[30] Foreign Application Priority Data

Dec. 27, 1994 [JP] Japan ................................. 6-325454

[51] Int. Cl.⁶ ........................... H01L 23/02; H01L 23/34; H01L 23/29
[52] U.S. Cl. ..................... 257/679; 257/678; 257/723; 257/790; 361/737
[58] Field of Search ..................................... 257/678, 679, 257/723, 790; 361/737; 235/492

[56] References Cited

U.S. PATENT DOCUMENTS

| | | | |
|---|---|---|---|
| 4,216,577 | 8/1980 | Badet et al. ................. | 29/831 |
| 4,532,419 | 7/1985 | Takeda ........................ | 235/492 |
| 4,625,102 | 11/1986 | Rebjock et al. ............. | 235/492 |
| 4,737,620 | 4/1988 | Mollet et al. ................ | 235/492 |
| 4,897,534 | 1/1990 | Haghiri-Tehrani .......... | 235/488 |
| 4,931,853 | 6/1990 | Ohuchi et al. ............... | 257/679 |
| 4,962,415 | 10/1990 | Yamamoto et al. ......... | 257/679 |
| 5,416,358 | 5/1995 | Ochi et al. ................... | 257/675 |
| 5,422,514 | 6/1995 | Griswold et al. ............ | 257/679 |
| 5,461,256 | 10/1995 | Yamada et al. ............. | 257/679 |
| 5,520,863 | 5/1996 | Ochi et al. ................... | 264/46.5 |
| 5,521,433 | 5/1996 | Hirata et al. ................ | 257/679 |
| 5,578,868 | 11/1996 | Obuchi et al. ............... | 257/679 |
| 5,637,858 | 6/1997 | Hoppe et al. ................ | 235/492 |

FOREIGN PATENT DOCUMENTS

| | | | |
|---|---|---|---|
| 58-134456 | 8/1983 | Japan ........................... | 257/679 |
| 2212197 | 8/1990 | Japan . | |

*Primary Examiner*—Teresa M. Arroyo

[57] ABSTRACT

A non-contact IC card and a method and apparatus for manufacturing the IC card. The IC card has a small thickness and is manufactured at a low cost, automatically. Electronic parts are mounted on a circuit pattern on a surface of a resin sheet. A filling resin covers the elcetronic parts and fills gaps between them. An electronically insulating plastic material on the filling resin wraps around the filling resin, contacting its side surfaces and saide surfaces of the resin sheet. The plastic material provides added protection to the electronic parts. In a method of manufacturing the non-contact IC card, the laminated structure of the resin sheet, filling resin, and plastic material is subjected to two sequential severing steps. In the first severing step, only the resin sheet and the filling resin are severed, generally in the shape of an IC card that is to be completed. The plastic material is not severed and extends over side surfaces of the resin sheet and filling that are produced in the first cutting step. The plastic material is severed so that it extends beyond the side surfaces of the resin filling material and resin sheet. Finally, the overhanging parts to the resin material are deformed and bent to cover and protect the side surfaces of the resin sheet and the filling resin.

2 Claims, 10 Drawing Sheets

NON-CONTACT TYPE IC CARD

BACKGROUND OF THE INVENTION

1. Field of the Invention

The present invention relates to a non-contact type IC card and circuit board and to a method and apparatus for manufacturing a non-contact type IC card.

2. Description of the Related Art

Figure 22:
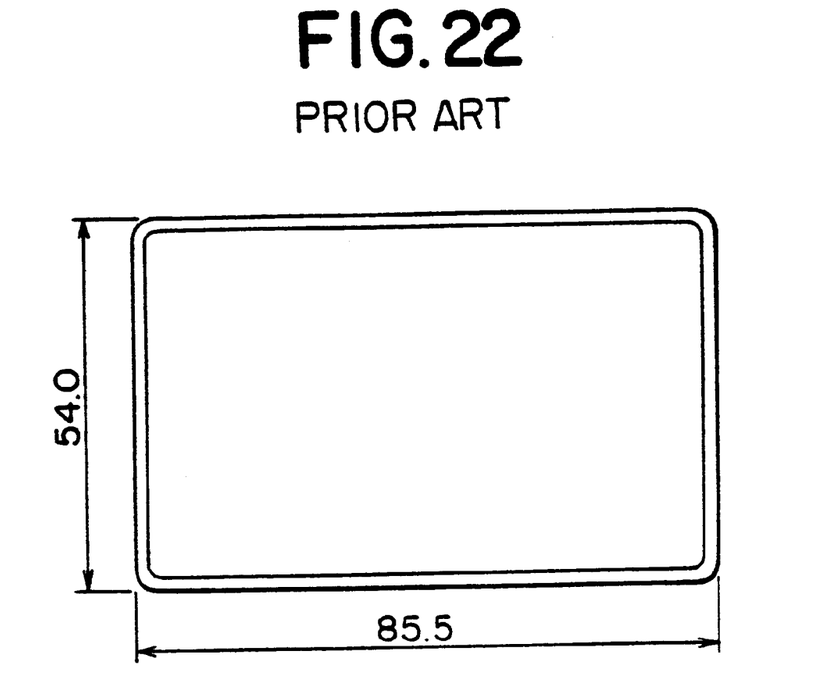
FIG. 22 is a plan view of a known non-contact type IC card.
Figure 23:
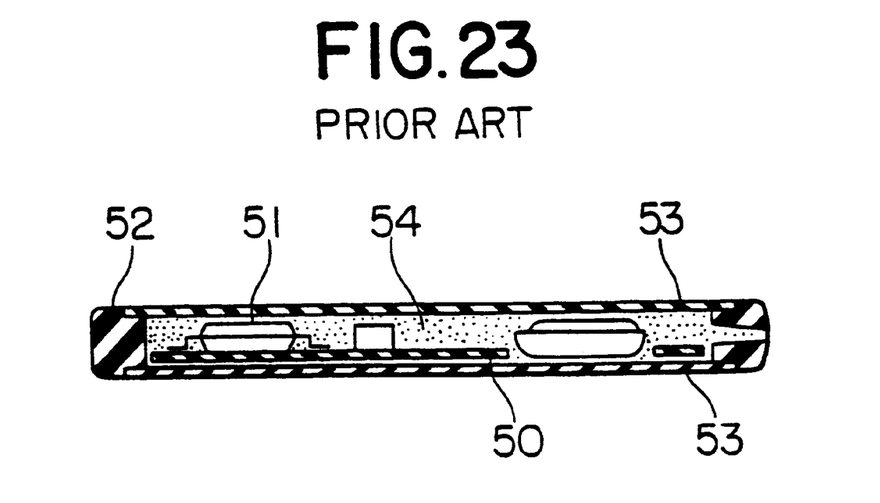
FIG. 23 is a side sectional view of a known non-contact type IC card.

FIGS. 22 and 23 are a front view and a sectional views respectively, of a known non-contact type IC card. In a known structure for a non-contact type IC card, a functional circuit part referred to as a module obtained by mounting electronic parts 51 on a circuit board 50 of a glass epoxy is put into a card-shaped plastic frame 52 which is filled with a resin 54 or the like and the surfaces of the card are sandwiched by plastic panels 53.

As disclosed in Japanese Patent Laid-Open No.2-212197, a technique has been provided as a method for manufacturing a non-contact type IC card in which a circuit board is constituted by a synthetic resin film and a circuit pattern is formed thereon by printing a conductive paste or by pressure-bonding a conductor foil by a heat treatment using a press A demand has arisen in resent years to reduce thickness of the card to the same level as a magnetic card or about 0.8 mm while at the same time reducing the cost of the card.

Figure 24:
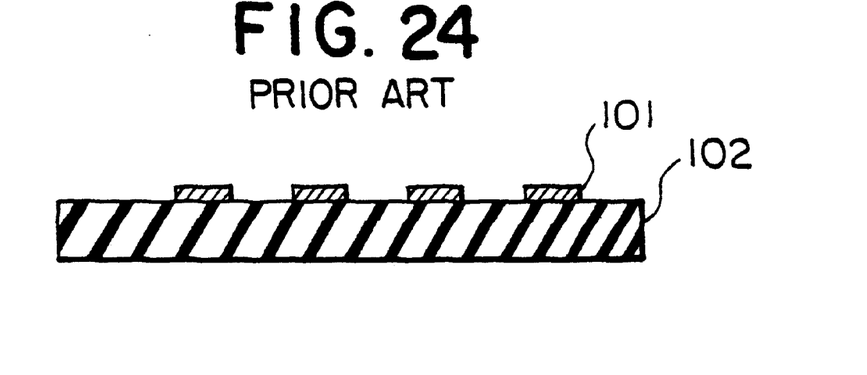
FIG. 24 is a sectional view of a circuit board showing another example of a known non-contact type IC card.
Figure 25:
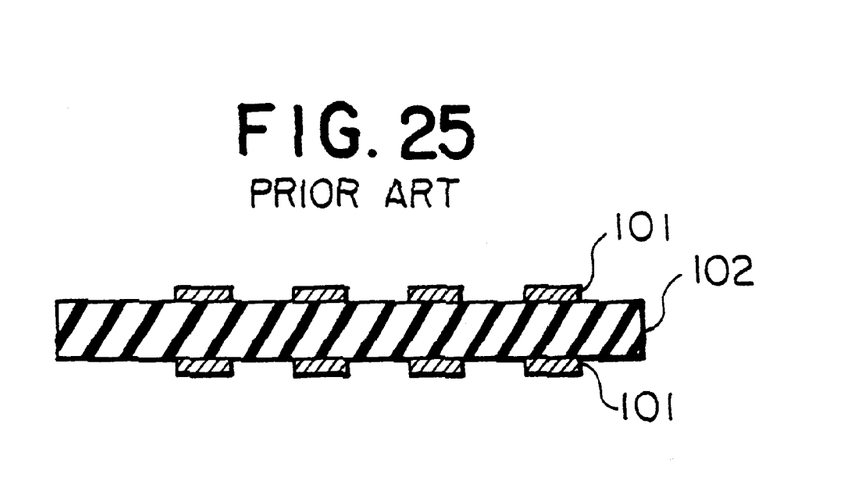
FIG. 25 is a sectional view of a circuit board showing another example of a known non contact type IC card.
Figure 26:
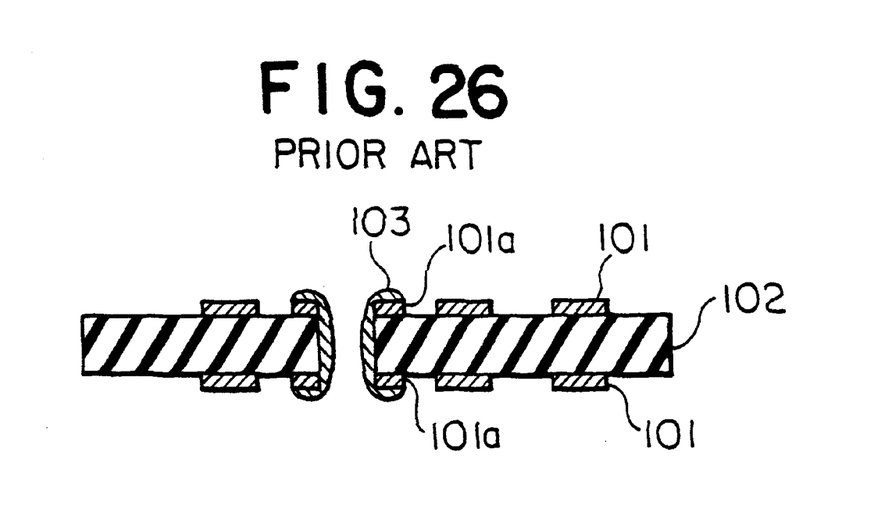
FIG. 26 is a sectional view of a circuit board-showing another example of a known non-contact type IC card.

FIG. 24 is a sectional view of a circuit board of another conventional IC card. In this conventional IC card, the circuit board is constructed such that a circuit pattern 101 is formed by etching a copper foil on a circuit board 102 which is made of an epoxy resin or phenol resin or the like. Further, as shown in FIG. 25, the circuit pattern 101 in some cases is formed on the both principal surfaces of the circuit board 102. For electrically connecting the circuit patterns 101 on the respective surfaces, a plating 103 covering and connecting two conductive lands 101a is applied, as shown in FIG. 26, to an inner circumferential surface of a hole through the conductive lands 101a to effect an electrical connection.

SUMMARY OF THE INVENTION

To meet the demand as described above, it is an object of the present invention to provide a non-contact type IC card and a method and apparatus for manufacturing the same capable of manufactured as having a small thickness at a low cost and capable of automatization and labor saving in its manufacturing process.

In a first aspect of the invention, there is provided a non-contact type IC card comprises: a sheet made of a resin having one surface defining an outer sheath of the IC card; a circuit pattern device including a conductive circuit pattern provided on the other surface of the sheet; electronic parts mounted on the circuit pattern device; and an electrically insulating plastic material provided on the other surface of the sheet and plastically deformed to completely cover the circuit pattern device and the electronic parts.

In a second aspect of the invention, a non-contact type IC card comprises: a sheet made of a resin having one surface defining an outer sheath of the IC card; a circuit pattern device including a conductive circuit pattern provided on the other surface of the sheet; electronic parts mounted on the circuit pattern device; an intermediate layer made of a resin secured on the circuit pattern device and having an opening for accommodating the electronic parts; and an electrically insulating filling resin material for filling a gap between the intermediate layer and the electronic parts.

In a third aspect of the invention, the non-contact type IC card has an outer sheath sheet made of a resin on the surface opposite to the sheet of the IC card.

In a non-contact type IC card according to a fourth aspect of the invention, electronic parts are mounted onto the circuit pattern as adhered thereto by a conductive adhesive.

In a non-contact type IC cord according to a fifth aspect of the invention, the electronic parts are mounted onto the circuit pattern device formed by a printing as bonded thereon by means of a pressure before curing of the circuit pattern of the circuit pattern device.

In a non-contact type IC card according to a sixth aspect of the invention, at least two sides of the non-contact type IC card are shaped as cut off by a cutting edge.

In a non-contact type IC card according to a seventh aspect of the invention, the circuit pattern device is constituted by a plurality of electrically insulating sheets laid one upon another, circuit patterns formed respectively on the plurality of sheets and a connecting means for electrically connecting the circuit patterns to each other.

In a non-contact type IC card according to an eighth aspect of the invention, the circuit pattern device is constituted by at least one electrically insulating sheet, circuit patterns formed on the both surfaces of the sheet and a connecting means for electrically connecting the circuit patterns formed on the both surfaces to each other.

In a ninth aspect of the invention, a method for manufacturing a non-contact type IC card includes: a circuit pattern device forming step for forming a circuit pattern device including a conductive circuit pattern on the other surface of a sheet made of a resin having one surface defining an outer sheath of the IC card when completed; an electronic part mounting step for mounting electronic parts on the circuit pattern device; a plastic material compressing step for compressing on the sheet an electrically insulating plastic material placed on the circuit pattern device and the electronic parts to form an integrated plate-like body by plastically deforming the plastic material to completely cover the circuit pattern device and the electronic parts; and a severing step for severing the plate-like body having the sheet and the intermediate layer to form an IC card.

In a tenth aspect of the Intention, a method for manufacturing a non-contact type IC card includes: a circuit pattern device forming step for forming a circuit pattern device including a conductive circuit pattern on the other surface of a sheet made of a resin having one surface defining an outer sheath of the IC card when completed; an electronic part mounting step for mounting electronic parts on the circuit pattern device; an intermediate layer securing step for securing an intermediate layer made of a resin having an opening for accommodating electronic parts onto the circuit pattern device; a filling resin material filling step for filling a gap between the intermediate layer and the electronic parts with a filling resin material to form an integrated plate-like body; and a severing step for severing the plate-like body having the sheet and the intermediate layer to form an IC card.

In a method for manufacturing a non-contact type IC card according to an eleventh aspect of the invention, the circuit pattern device forming step includes the steps of: laying a plurality of sheets each formed with a circuit pattern one upon another; and electrically connecting the circuit patterns to each other.

In a method for manufacturing a non-contact type IC card according to a twelfth aspect of the invention, the circuit pattern device forming step includes the steps of: forming circuit patterns on the both surfaces of a sheet; and electrically connecting the circuit patterns formed on the both surfaces to each other.

A method for manufacturing a non-contact type IC card according to a thirteenth aspect of the invention further includes an outer sheath sheet bonding step for bonding an outer sheath sheet made of a resin onto the surface opposite to the sheet of the IC card prior to the severing step.

In a method for manufacturing a non-contact type IC card according to a fourteenth aspect of the invention, the circuit pattern device forming step includes a circuit pattern forming step to be performed by a printing.

In a method for manufacturing a non-contact type IC card according to a fifteenth aspect of the invention, the circuit pattern device forming step includes a circuit pattern forming step to be performed by a transfer.

In a method for manufacturing a non-contact type IC card according to a sixteenth aspect of the invention, the electronic part mounting step is a step of mounting the electronic parts onto the circuit pattern by means of adhesion thereto by a conductive adhesive.

In a method for manufacturing a non-contact type IC card according to a seventeenth aspect of the invention, he electronic part mounting step is a step of bonding the electronic parts to the circuit pattern using a pressure prior to curing of the circuit pattern.

In a method for manufacturing a non-contact type IC card according to a eighteenth aspect of the invention, the plastic material compressing step is performed by means of a press.

In a method for manufacturing a non-contact type IC card according to a nineteenth aspect of the invention, the circuit pattern device forming step includes: a step of forming a test terminal or the circuit pattern device; and a test step for performing a test on circuit function by connecting a circuit tester to the test terminal prior to the severing step.

In a twentieth aspect of the invention, an apparatus for manufacturing a non-contact type IC card comprises: a circuit pattern device forming device for forming a circuit pattern device on the other surface of a sheet made of a resin having one surface defining an outer sheath of the IC card when completed; an electronic part mounting device for mounting electronic parts on the circuit pattern device; a plastic material compressing device for compressing on the sheet a plastic material placed on the circuit pattern device and the electronic parts to form an integrated plate-like body by plastically deforming the plastic material to completely cover the circuit pattern and the electronic parts; and a severing device for severing the plate-like body to form an IC card.

In a twenty-first aspect of the invention, an apparatus for manufacturing a non-contact type IC card comprises: a circuit pattern device forming device for forming a circuit pattern device on the other surface of a sheet made of a resin having one surface defining an outer sheath of the IC card when completed; an electronic part mounting device for mounting electronic parts on the circuit pattern device; an intermediate layer securing device for securing an intermediate layer made of a resin having an opening for accommodating electronic parts onto the circuit pattern device; a filling resin material filling device for filling a gap between the intermediate layer and the electronic parts with a filling resin material to form an integrated plate-like body; and a severing device for severing the plate-like body to form an IC card.

DESCRIPTION OF THE PREFERRED EMBODIMENTS

Embodiment 1

Figure 1:
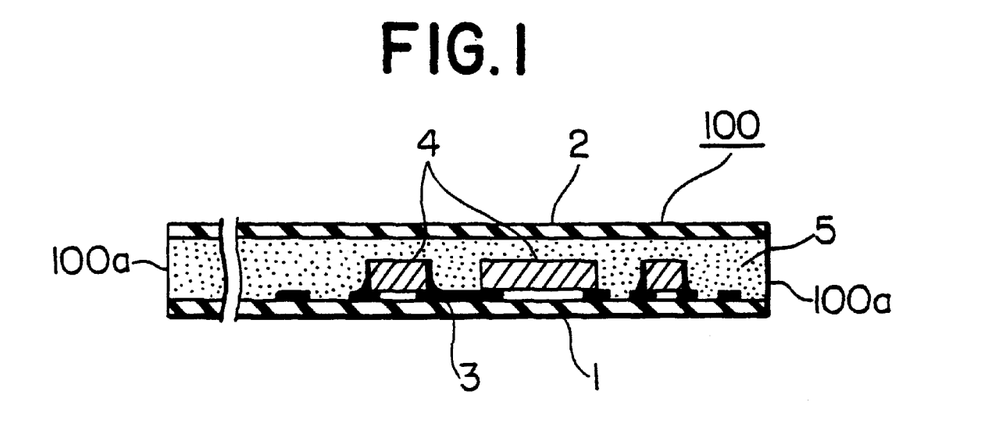
FIG. 1 is a sectional view of a non-contact type IC card according to the present invention.

A non-contact type IC card 100 according to the invention as shown in FIG. 1 has a sheet 1 made of a resin of which one surface is exposed to form an armor or an outer sheath for a lower surface of the IC card, and a circuit pattern 3 serving as a circuit pattern device is armed on an upper surface of the sheet 1. Electronic parts 4 are mounted on the circuit pattern 3 as electrically connected thereto. Disposed on the upper surface of the sheet 1 is a plastic material 5 which completely covers the circuit pattern 3 and the electronic parts 4 and is plastically deformed into the shape of a flat plate by a press. Adhered furthermore onto the upper surface of the plastic material 5 is an outer sheath sheet 2 of the same material as the sheet 1. Further, the four side surfaces 100a of the IC card 100 are cut off by a cutting edge to form an IC card having a standard shape.

The sheet 1 and sheet 2 are constituted by PET (polyethylene terephthalate) material or by sheets of materials of the same type. Further, the plastic material 5 is constituted by a thermoplastic prepreg material (such as WIP PP/GF) having an electrically insulating characteristic.

Figure 2:
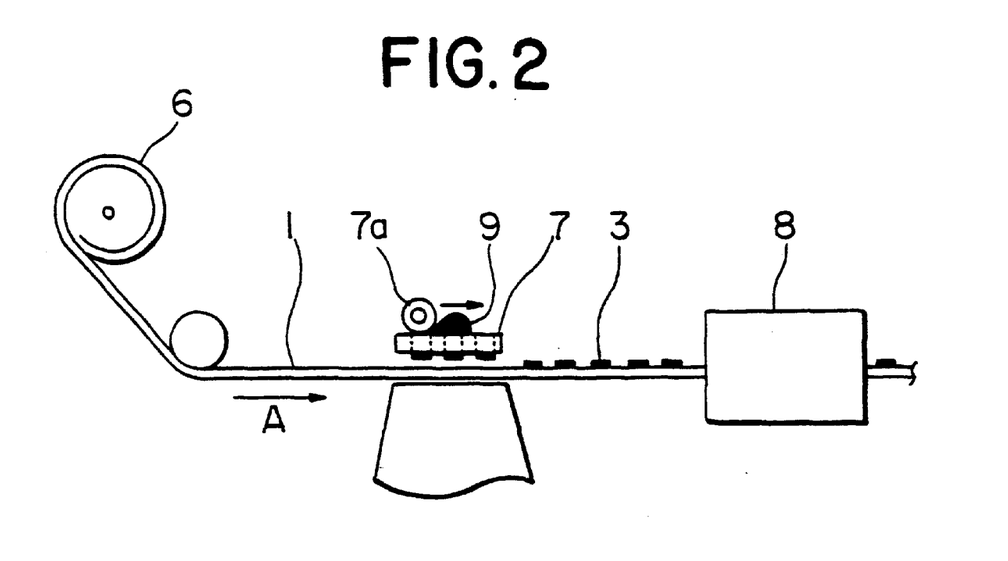
FIG. 2 shows a device including a circuit pattern device forming device.

A method for producing the non-contact type IC card 100 constructed as the above will now be described. FIG. 2 shows a system including a screen printing machine 7 serving as a circuit pattern device forming device which is a part of the apparatus for manufacturing the non-contact type IC card 100. The sheet 1 is formed as a strip having a thickness of the order of 0.1 to 0.2 mm and is wound into of a roll 6. The sheet 1 in the roll state is sequentially fed in the direction of arrow A toward the screen printing machine 7.

The screen printing machine 7 serving as the circuit pattern device forming device forms the circuit pattern 3 on the sheet 1 by pushing out a conductive ink or conductive paste 9 such as silver or carbon) by means of a roller 7a. The apparatus is constructed so that the sheet 1 with a screen printing thereon is dried and cured in a drying furnace 8 and is then sent to a next processing step.

Figures 3, 4:
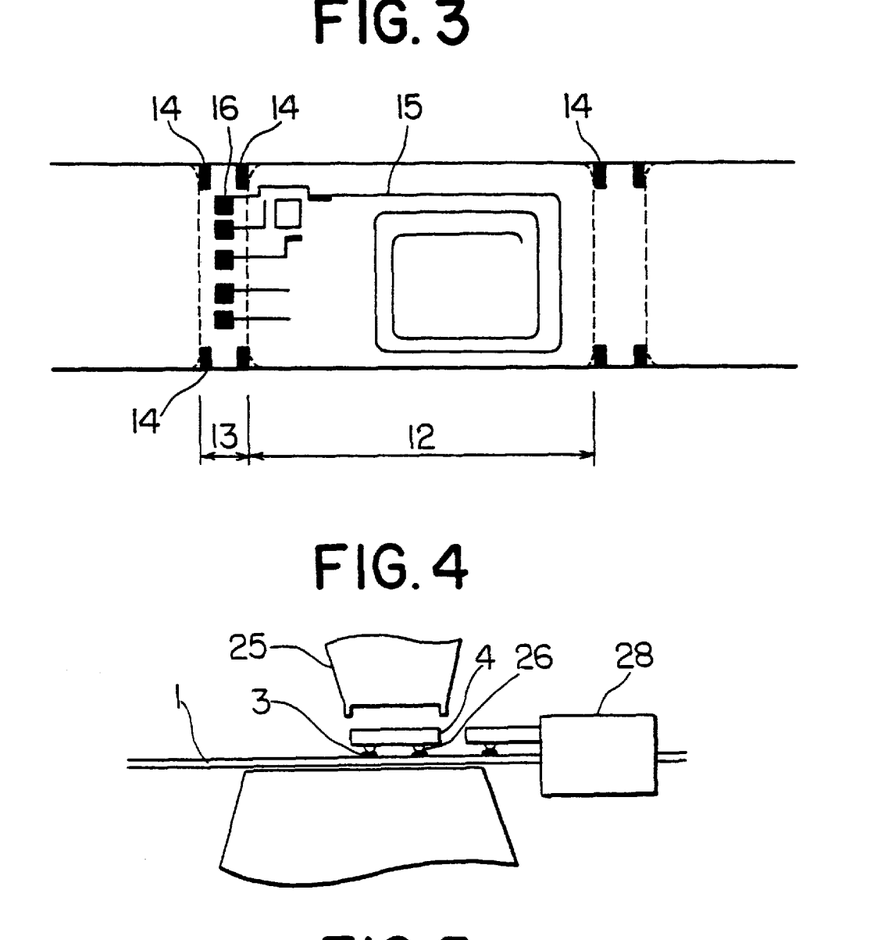
FIG. 3 is a front view of a sheet printed on the circuit pattern.
FIG. 4 shows an electronic part mounting device including a chip mounter.

FIG. 3 is a front view of the sheet 1 with a circuit pattern 3 printed thereon. The sheet 1 is generally divided into: a mount area 12, which is a portion to be mounted on the card, with the circuit pattern 3 consisting of an antenna 15, etc., being printed thereon; and a testing area 13 having a test electrode 16 printed thereon to be cut off at a later step. Identification marks 14 are printed respectively at boundary portions for the purpose of positioning in the severing step to be performed later.

FIG. 4 shows an electronic part mounting device which is a part of the apparatus for manufacturing the non-contact type IC card 100 and includes a chip mounter 25. What is performed here is the step of mounting the electronic parts 4 on the circuit pattern 3, which follows the circuit pattern forming step of FIG. 2. The electronic parts 4 are mounted at predetermined positions on the circuit pattern 3 by the chip mounter 25. Here, connection of bumps 26, which are the electrodes for the electronic parts 4, is possible by applying a conductive adhesive to the bumps 26. Drying and curing are effected thereafter in a curing and drying furnace 28.

Figure 5:
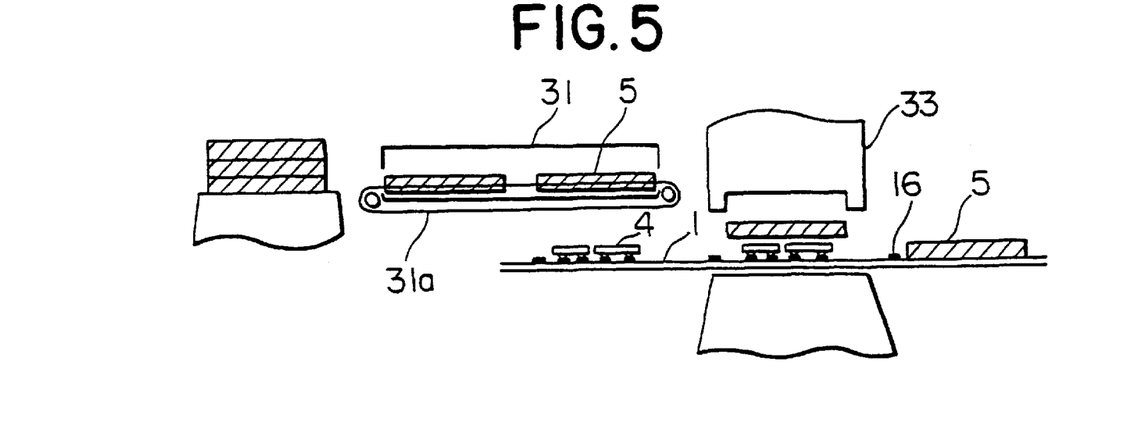
FIG. 5 shows a plastic material compressing device including a heater and a press.

FIG. 5 shows a plastic material compressing device which is a part of the apparatus for manufacturing the non-contact type IC card 100 and includes a heater 31 and a press 33. The plastic material 5 has substantially the same size as the IC card and receives heat from the heater 31 (about 200° C.) to be softened. The plastic material 5 is supplied to a position over the circuit pattern 3 and electronic parts 4 of the sheet 1 by a conveyor 31a or the like which is moved in synchronization, with the travelling of the sheet 1, and it is subjected to stamping by the press 33 so as to be plastically deformed in a manner completely covering the electronic parts 4 which are mounted on the sheet 1. Since the plastic material 5 is softened by heat, it is plastically deformed by a pressure from the press 33 and reaches the circuit pattern 3 to be formed into a predetermined thickness while filling the gap between the electronic parts 4. The plastic material 5 and the sheet 1 are adhered to each other by means of compression and, at this point, the plastic material 5 has substantially the size of the IC card 100. At this time, the test terminal 16 is exposed without being covered by the plastic material 5.

Figure 6:
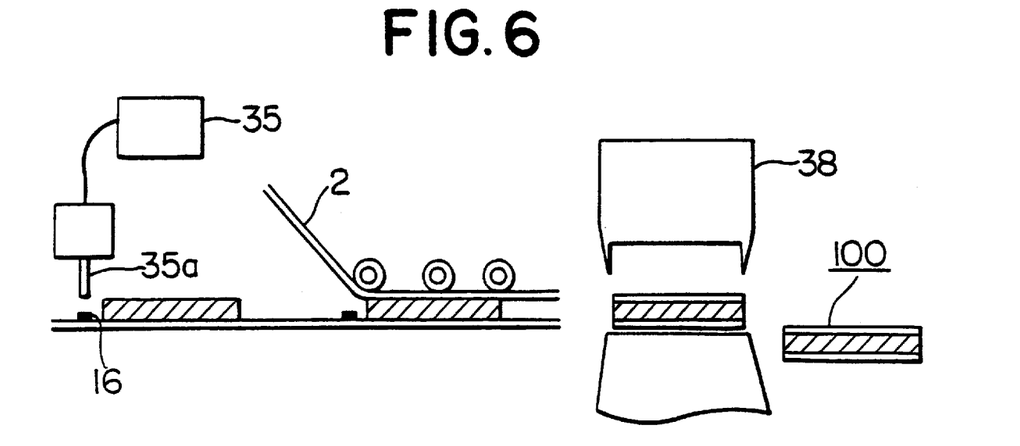
FIG. 6 shows a checking device including a circuit tester and severing device including a cutter.

FIG. 6 shows a checking device including a circuit tester and a severing device including a cutter which constitute a part of the apparatus for manufacturing the non-contact type IC card 100. As shown in FIG. 6, a test head 35a of the circuit tester 35 is brought into contact with the exposed test terminal 16 to check the circuit function. Thereafter, positioning is effected using the identification marks 14 on the sheet 1 and the outer sheath sheet 2 is adhered to the card surface. Cutting into the shape of a card is then effected by the cutter 38 which is designed to have the size of a card. The severing is effected so that the cut surfaces are perpendicular to the main surface of the IC card in the form of a plate and the plastic material 5 is exposed. Although the cut surface of the test terminal 16 is also exposed, it causes no problem in using the IC card because it is very thin.

Figure 7:
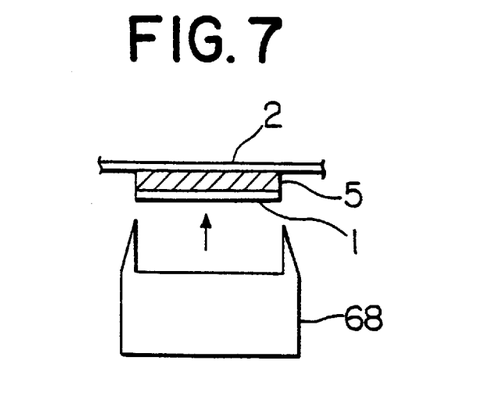
FIG. 7 shows the manner of cutting off by a cutter starting from the bottom in a severing step.
Figure 8:
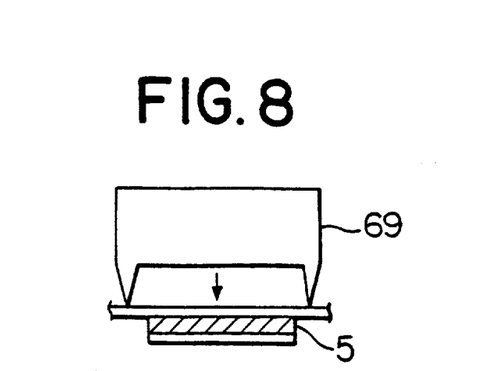
FIG. 8 shows the manner of cutting off by a cutter starting from the top in a severing step.
Figure 9:
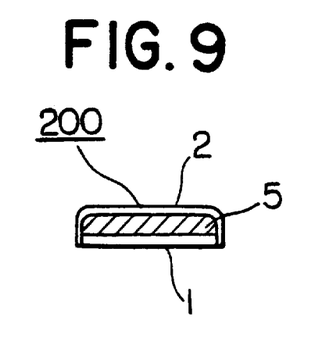
FIG. 9 is a sectional view of a non-contact type IC card severed by the cutters as shown in FIGS. 7 and 8.

It should be noted that such as the following method may be used to prevent the cut surface of the plastic material 5 and test terminal 16 from being exposed on an end surface of the card. As shown in FIGS. 7 and 8, the edge of the cutter is penetrated in two steps when effecting the severance. First, severing of only the sheet 1 and plastic material 5 is effected starting from the bottom of the IC card by a first cutter 68 which is somewhat smaller than the shape of the card. Next, by severing starting from the top with a second cutter 69 which is somewhat larger than the shape of the card, the outer sheath sheet 2 is cut off while being bent to cover the plastic material 5 at the end surface of the IC card so as to form an outer sheath for the sic a surface of the IC card 200 when compressed by the inside surface of the second cutter 69. In the IC card 200 constructed as described, the cut surface of the plastic material 5 and test terminal 16 is covered by the outer sheath sheet 2 and does not appear on the end surface of the IC card (FIG. 9). As shown in FIG. 9, the outer sheath sheet 2 also covers the cut surface of the sheet 1.

In the non-contact type IC card 100 constructed as described, the sheet 1 serves the functions of both a circuit board for mounting electronic parts 4 and an outer sheath of the IC card. Further the plastic material 5 completely covers the circuit pattern 3 formed on the sheet 1 and the electronic parts mounted thereon, thereby protecting the electronic parts 4 and the circuit pattern 3 and at the same time forming an outer sheath of the IC card 100. the thickness of the IC card 100 may thus be reduced and its strength against an external force is improved.

Further, the outer sheath sheet 2, together with the sheet 1, forms the outer sheath of the IC card which is excellent in water resistance and oil resistance, and the IC card 100 is further improved in strength.

Furthermore, since the electronic part 4 is mounted on the circuit pattern 3 as adhered thereto by means of a conductive adhesive, so the reliability of the connection is improved.

Moreover, since the non-contact type IC card 100 is cut off at its sides by a cutting edge, the cost may be lowered because the number of component parts is smaller as there is no frame constituting the sides.

In the method for manufacturing a non-contact type IC card 100 as described, the manufacturing steps are performed in a continuous succession and it is possible to place the manufacturing steps into a line and to implement automation so that fewer manufacturing steps and a shorter manufacturing time may be achieved to lower the cost Further, the circuit pattern 3 has a small thickness due to printing so that the IC card 100 may be manufactured with a small thickness.

Furthermore, since the electronic parts 4 are mounted on the circuit pattern 3 with a conductive adhesive, the work required in the mounting step becomes simpler and the reliability of the connection between the electronic parts and the circuit pattern is improved.

Moreover, the plastic material 5 is formed as it quickly permeates the space among the electronic parts by a uniform force due to pressure, whereby the plastic material penetrates into and fills the space among the electronic parts to enhance the strength of the IC card 100 and it is possible to reduce time required for the manufacturing steps.

Further, the circuit function may be checked by connecting a test head of a circuit tester to the test terminal 16. The test head may thus have a simple configuration and checking of the circuit function during the manufacturing steps may be readily reformed.

Embodiment 2

Figure 10:
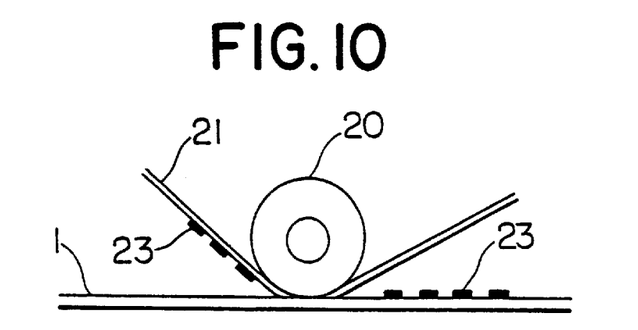
FIG. 10 shows a circuit pattern forming device which is another embodiment of the non-contact type C card manufacturing apparatus according to the invention.

FIG. 10 shows a circuit pattern device forming device which is another embodiment of the manufacturing apparatus for the non-contact type IC card. While in Embodiment 1, the formation of a circuit pattern has been by the screen printing machine 7 where a conductive ink or conductive paste 9 (such as silver or carbon) is pushed out by means of the roller 7a to form the circuit pattern 3 on the sheet 1, the circuit pattern may also be formed, for example, such that, as shown in FIG. 10, a thin gold foil 23 formed on a transfer film 21 is transferred or adhered to the sheet 1 by means of a heating roller 20.

In the method for manufacturing a non-contact type IC card as described above, the circuit pattern is formed as having a small thickness by transfer. The IC card may thus be manufactured as having a small thickness and the time required for the work may be reduced.

Embodiment 3

Figure 11:
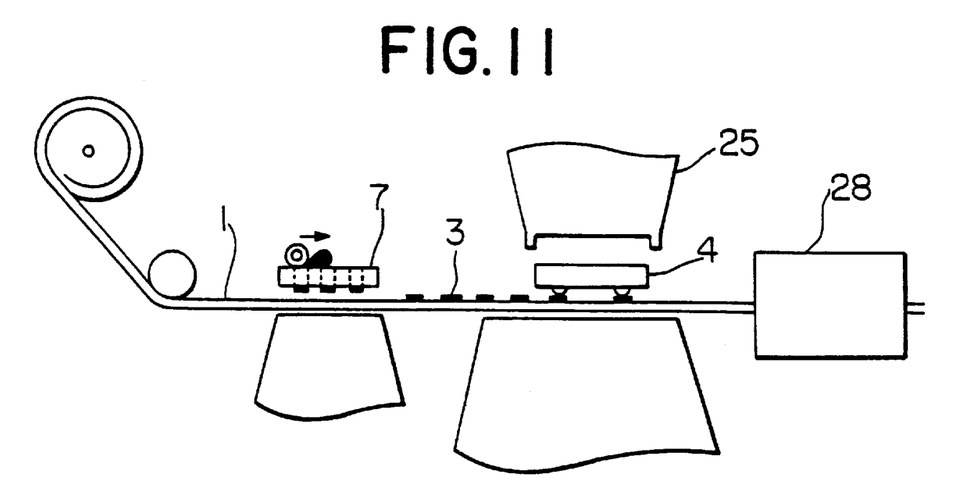
FIG. 11 shows an apparatus without a curing drying furnace after the circuit pattern forming device which is another embodiment of a non-contact type IC card manufacturing apparatus according to the invention.

FIG. 11 shows another embodiment of the manufacturing apparatus for the non-contact type IC card where the drying furnace 8 after the circuit pattern device forming device is eliminated. In this embodiment, as shown in FIG. 11, after printing the circuit pattern 3 by means of screen printing, the electronic parts 4 are adhered thereto under pressure of the chip mounter 25, before the circuit pattern 3 is dried and cured. Thereafter, drying/curing is effected at a curing drier 28. By using this method, the drying furnace 8 may be omitted to facilitate the steps in the manufacturing process.

In the non-contact type IC card constructed as described, the electronic parts are mounted on the circuit pattern 3 by pressure-bonding prior to its curing. Thus, the reliability of the connections between the electronic parts 4 and the circuit pattern 3 is improved and a material or connecting the electronic parts 4 and the circuit pattern 3 is not required.

In the above manufacturing method, the electronic parts 4 are mounted on a molten circuit pattern 3 by pressure-bonding, whereby work required in the mounting step is simplified and a material for the connection thereof is not required and the reliability of the connection between the electronic parts 4 and the circuit pattern 3 is improved.

Embodiment 4

Figure 12:
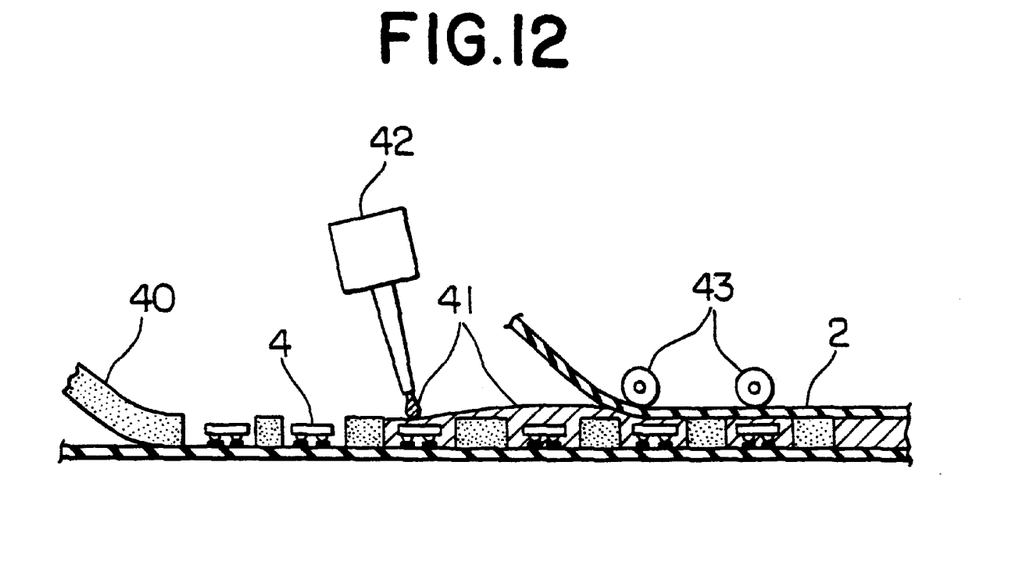
FIG. 12 shows a method for manufacturing a non-contact type IC card using an intermediate layer which is another embodiment of a non-contact type IC card manufacturing apparatus according to the invention.

FIG. 12 shows another embodiment of the non-contact type IC card in its state of being manufactured. While, in Embodiment 1, a plastic material 5 consisting of a thermoplastic prepreg material is used to fill the space between the electronic parts 4, used in this embodiment is a buffer sheet 40 serving as an intermediate layer made of a resin (such as a glass epoxy resin sheet or phenolic resin plate). An adhesive is applied on a back surface of the buffer sheet 40 on which a hole corresponding to the electronic part mounting portion is previously provided. After adhering it onto the circuit pattern 3, the portion of gaps with the electronic parts 4 in the hole is filled with a reactive resin 41 which is a filling resin material (such as an epoxy adhesive by a filling resin material filling apparatus 42. After adhering the outer sheath sheet 2 thereto, the card is formed as cured by means of a heat by using a heating and pressure-bonding roller 43 which serves as an intermediate layer securing apparatus.

According to this method, since the plastic material 5 of thermoplastic prepreg material is not used, the heater 31 is not necessary and the construction of the manufacturing apparatus is simpler.

In the non-contact type IC card constructed as described, the buffer sheet 40 serving as an intermediate layer, together with the reactive resin 41, completely covers the circuit pattern formed on the sheet and the electronic parts mounted thereon, thereby protecting the electronic parts and the circuit pattern and forming an outer sheath of the IC card. Thus, the strength of the IC card is further improved.

In the above manufacturing method, the manufacturing steps are performed in a continuous succession and it is possible to get the manufacturing steps into line and to implement an automation thereof; in addition, the method is possible without a compressing step. Fewer manufacturing steps and shorter manufacturing time may thus be achieved to lower the cost.

Embodiment 5

Figure 13:
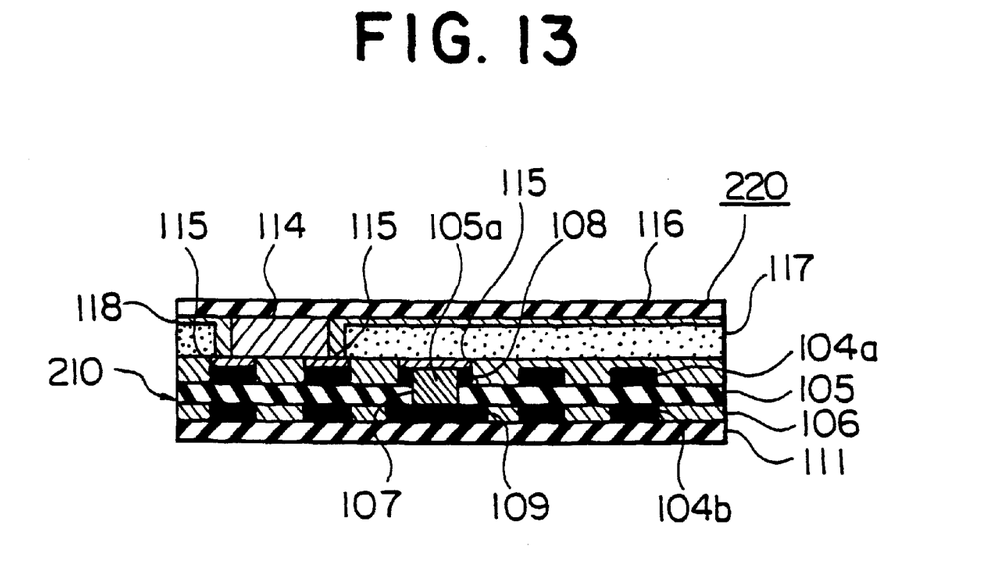
FIG. 13 is a sectional view showing another example of a non-contact type IC card according to the invention.

FIG. 13 is a sectional view showing another example of non-contact type IC card according to the present invention. Figs. 14 to 17 show a manufacturing process of a non-contact type IC card in accordance with the sequence of the process. Referring to FIG. 13, a noncontacting IC card 220 has a first sheet 105 and a second sheet 111. A circuit pattern 104a is formed on a surface of the first sheet 105. Further, a circuit pattern 104b is formed on a surface of the second sheet 111.

The first sheet 105 and second sheet 111 are constituted for example by a PET (polyethylene terephthalate) material or by sheets of materials of similar type. The first sheet 105 and second sheet 111 are adhered to each other by an adhesive 106.

Formed on the surface of first sheet 105 and second sheet 111 respectively as a part of the circuit pattern 104a and a part of the circuit pattern 104b are conductive lands 108 and 109 which serve as connection means for electrically connecting the circuit pattern 104a and circuit pattern 104b to each other. The conductive lands 108 and 109 are formed at corresponding positions on the respective surfaces of the first sheet 105 and second sheet 111.

A hole 105a is formed on the upper-side first sheet 105 at a center portion of the conductive land 108 in a manner passing through the conductive land 108 and also through the sheet 105 thereunder. The hole 105a is filled with a conductive resin 107. The conductive resin 107 electrically connects the conductive lands 109 and 108 to each other and thus electrically connects the circuit pattern 104a to the circuit pattern 104b.

The first sheet 105 and second sheet 111 laid upon each other and the circuit patterns 104a, 104b formed or the respective sheets constitute a circuit board 210. Further, the first sheet 105, the circuit patterns 104a, 104b and the conductive resin 107 constitute a circuit pattern device provided on the other surface of the second sheet 111. An electronic part 114 such as a capacitor or IC is mounted on the circuit pattern 104a formed on the first sheet 105 of the circuit board 210. The electronic part 114 is connected to the circuit patterns 104a through a conductive adhesive 115.

A buffer sheet 117 made of a resin serving as an intermediate layer and having a hole previously provided at a portion thereof for mounting electronic parts is placed over the portion of circuit pattern 104a without the electronic part 114 placed thereon. The buffer sheet 117 is constituted for example by the material of a glass epoxy resin sheet or phenol resin plate.

A third sheet 116 is place upon the buffer sheet 117, and the respective gaps among the circuit board 210, electronic part 114, buffer sheet 117 and third sheet 116 are filled with a reactive resin 118 which is a filling resin material (an epoxy adhesive or the like). The four side surfaces of the IC card 220 are cut off by a cutting edge to result the shape of a standard type IC card.

Figure 14:
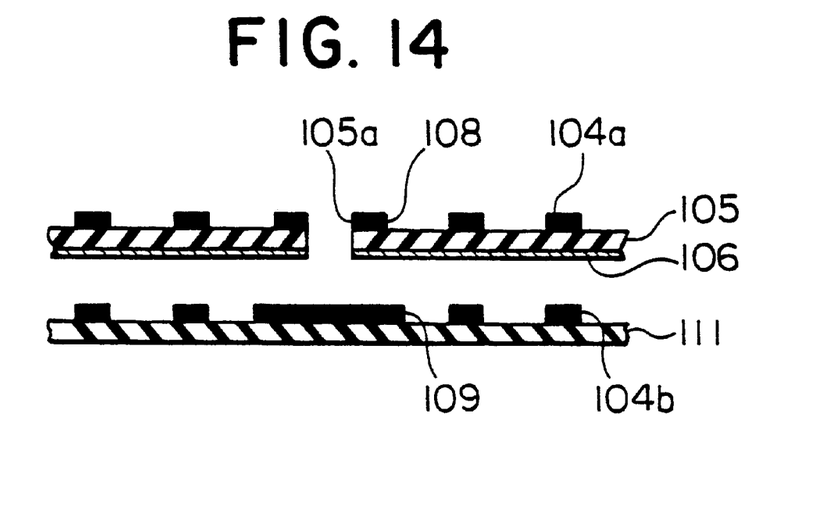
FIG. 14 shows a manufacturing process of a non-contact type IC card in accordance with the invention.

FIGS. 14 to 17 show the manufacturing process of the non-contact type IC card 220 in accordance with the sequence of the process. First, as shown in FIG. 14, the circuit pattern 104a and circuit pattern 104b are formed on the first sheet 105 and second sheet 111, respectively. In a similar manner as in Embodiment 1, the first sheet 105 and second sheet 111 are sequentially supplied from their state of being rolled and advance to a screen printing machine, respectively, and the circuit patterns ire formed as printed by the screen printing machine such that a conductive ink or conductive paste (such as silver or carbon) is pushed out onto the sheets by means of a roller.

Next, a hole 105a is formed at a center portion of the conductive land 109 and the adhesive 106 is applied onto the back surface of the first sheet 105.

Figure 15:
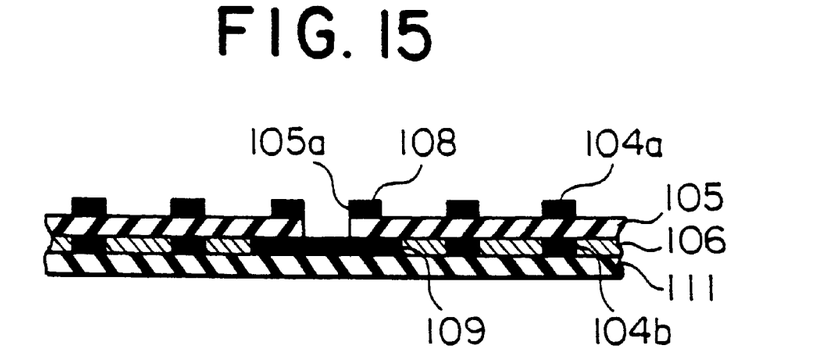
FIG. 15 shows a manufacturing process of a non-contact type IC card in accordance with the invention.
Figure 16:
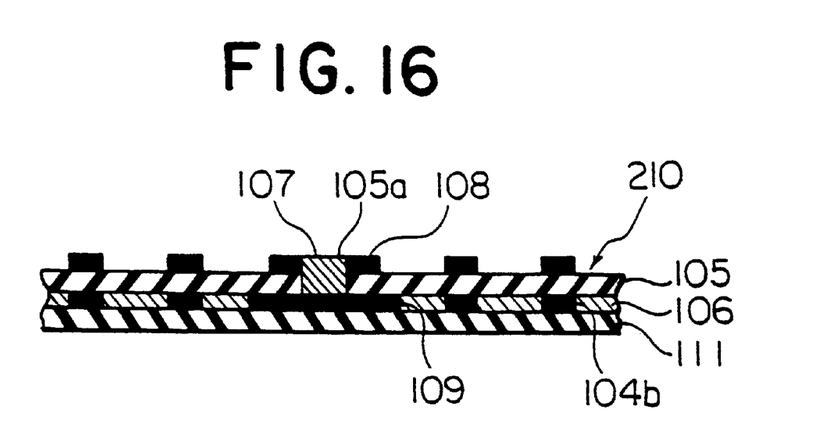
FIG. 16 shows a manufacturing process of a non-contact type IC card in accordance with a invention.

Next, as shown in FIG. 15, the first sheet 105 and second sheet 111 are adjusted in their position with respect to each other by a register mark (not shown) and are then pressure-bonded by a press to be laid upon each other. Further, as shown in FIG. 16, a conductive resin 107 is supplied into and then cured in the hole 105 a by printing or dispensing.

It should be noted that the conductive land 108 is formed to have a large size as compared to the hole 105a, whereby it is possible to reduce the problem of conduction defect in the case where the first sheet 105 and second sheet 111 are incorrectly positioned with respect to each other.

Figure 17:
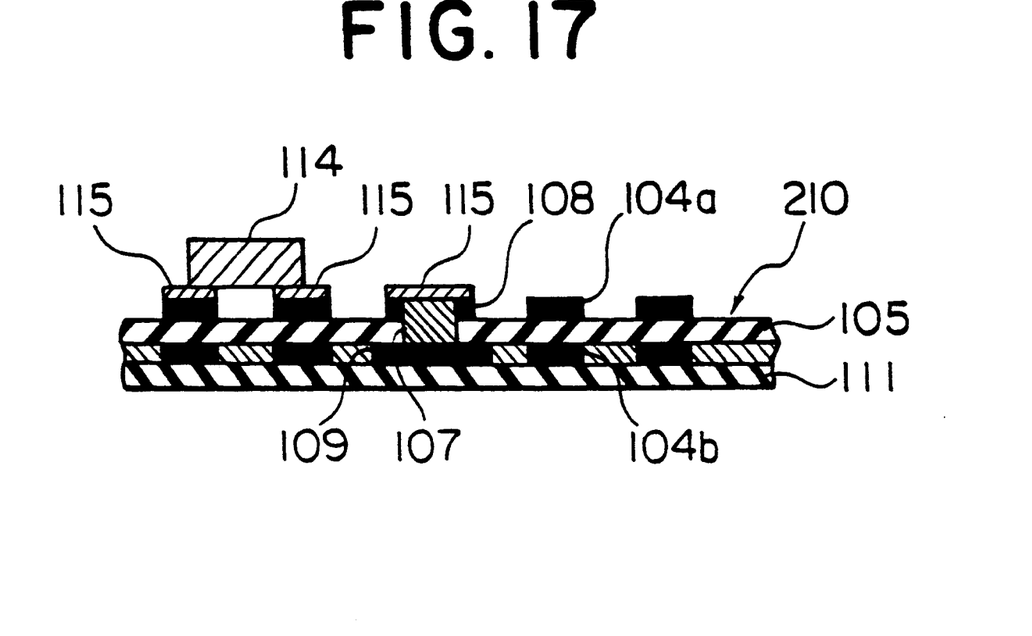
FIG. 17 shows the manufacturing process of a non-contact type IC card in accordance with the invention.

Next, as shown in FIG. 17, the electronic part 114 such as a capacitor or IC is mounted on the circuit board 210. The electronic part 114 is connected to the circuit pattern 104a through the conductive adhesive 115.

The conductive resin 107 and the conductive adhesive 115 are made of the same material and may be supplied in the same processing step for example by screen printing though it is also possible to supply them separately.

Next, in a similar manner Has in Embodiment 4, a member obtained as applying an adhesive to the back surface of the buffer sheet 117 which is previously provided with a hole at a portion thereof for mounting electronic parts is adhered to the circuit pattern 104a; then the gap portion with the electronic part 114 in the hole is filled with the reactive resin 118; and, after an outer sheath sheet 116 is adhered thereto, it is formed as cured by a heat using a heating and pressure-bonding roller. Finally, the four side surfaces thereof are cut off to complete the non-contact type IC card 220.

While, in the present embodiment, the buffer sheet 117 serving as an intermediate layer is placed over the portion of circuit pattern 104a without the electronic part 114 mounted thereon, it is also possible similarly as in Embodiment 1 to use a plastic material such as a thermoplastic prepreg material to fill the space with the electronic part 114.

While the number of sheets for constructing the circuit board 210 in the present embodiment is two, the number may be increased as required. Further, while the electronic part 114 is not mounted on the conductive resin 107 in the present embodiment, it is possible to mount it thereon as required.

In the noncontacting IC card 220 constructed as described above, since the first sheet 105 and second sheet 111 are laminated and the circuit patterns 104a, 104b are formed on the respective sheets, many circuit patterns including an antenna, etc., may be constructed in a limited space.

Embodiment 6

Figure 18:
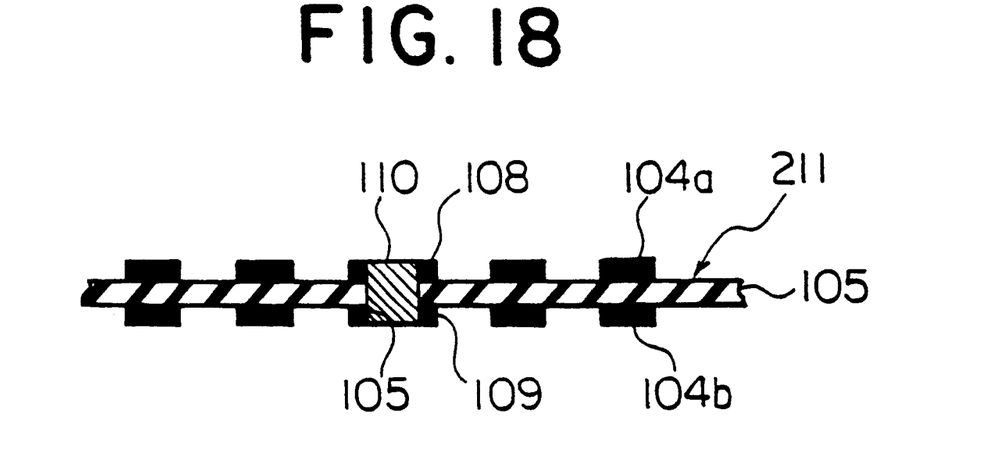
FIG. 18 is a sectional view of a circuit board showing another example of a non-contact type IC card according to the invention.

FIG. 18 is a sectional view of a circuit board showing another example of noncontacting IC card of the present invention. In this figure, circuit patterns 104a, 104b are provided on the two surfaces of a sheet 105 of a circuit board 211. To achieve an electric conduction between the circuit patterns 104a, 104b respectively provided on the two surfaces, conductive lands 108, 109 are formed at opposite positions on the two surfaces of the sheet 105. A hole 105a is provided through the conductive lands 108, 109. A connecting rod 110 made of Al is tightly inserted into the hole 105a. The connecting rod 110 constitutes the connecting means for electrically connecting the circuit patterns 104a, 104b to each other.

Thereafter, electronic pars (not shown) are mounted onto one or both surfaces of the circuit board 211; a plastic material is then placed thereon similarly as in Embodiment 1 or a buffer sheet is placed thereon similarly as in Embodiment 4 so as to protect the mounted electronic parts; and a second sheet and third sheet are then adhered respectively to further outside of the two surfaces to construct a noncontacting IC card.

In the circuit board constructed as described, since the connecting means for electrically connecting the circuit patterns 104a, 104b is provided by the connecting rod 110 made of Al, a device for filling with the conductive resin 107 is not required.

Embodiment 7

Figure 19:
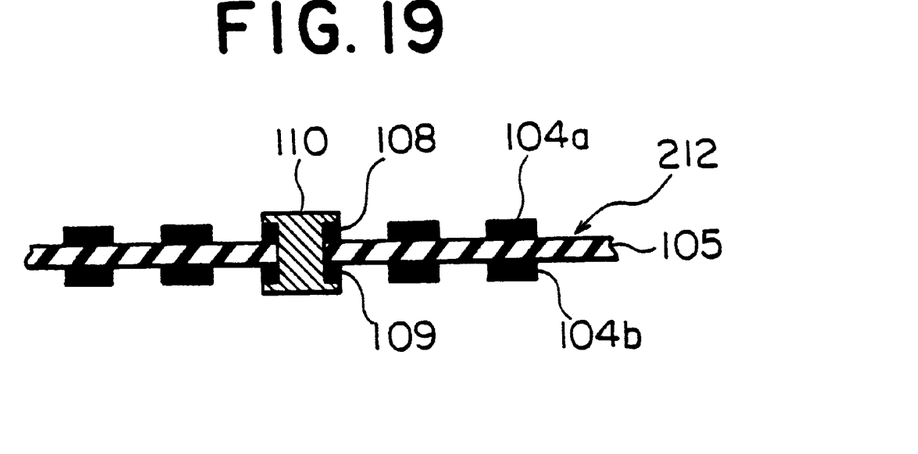
FIG. 19 is a sectional view of a circuit board showing another example of a non-contact type IC card according to the invention.
Figure 20:
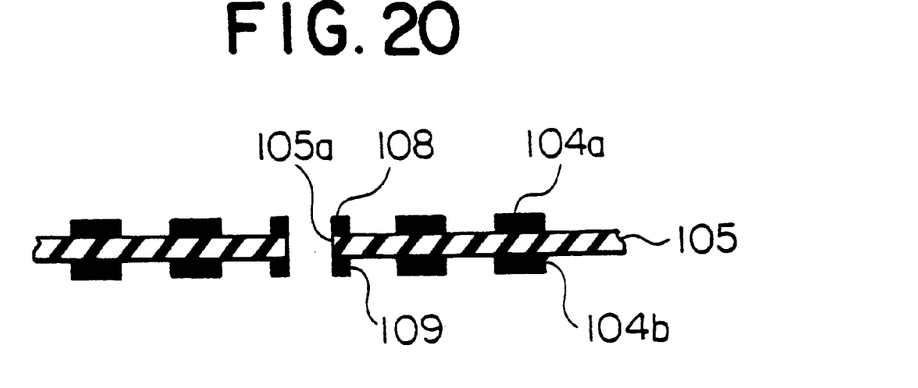
FIG. 20 shows a manufacturing process of a circuit board in accordance with the invention.
Figure 21:
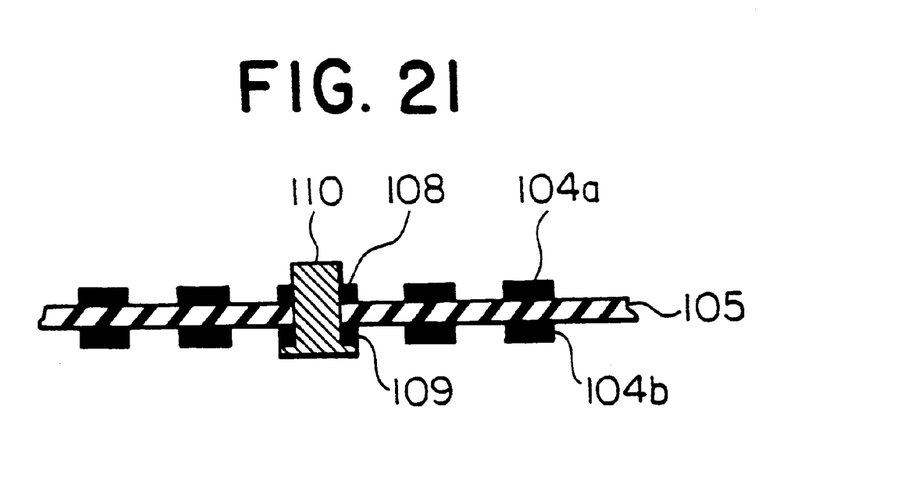
FIG. 21 shows a manufacturing process of a circuit board in accordance with the sequence of the process.

FIG. 19 is a sectional view of a circuit board showing another embodiment of the noncontacting IC card of the invention. FIGS. 20 and 21 show the manufacturing process of the circuit board in accordance with the sequence of the process. Referring to FIG. 19, while circuit board 212 is substantially identical to the circuit board 211 described in Embodiment 6, one end side of Al rod 110 has a larger diameter than the diameter of the hole 105a and the other end side thereof is flattened.

FIGS. 20 and 21 show the manufacturing method of the circuit board 212. First, as shown in FIG. 20, the hole 105a is bored on a sheet 105 which is formed with circuit patterns 104a, 104b respectively on the both surfaces thereof, at the position where conductive lands 108, 109 are provided for electrically connecting the circuit patterns 104a, 104b to each other.

Next, as shown in FIG. 21, the Al rod 110 is tightly inserted into the hole 105a from one side (the lower side as shown in FIG. 21) of the sheet 105. The diameter of the rear end of the Al rod 110 is larger than the diameter of the hole so as to attain a sufficient electric conduction. Further, the length of the Al rod 110 is longer than the depth of the hole 105a. Then, the portion extended to the outside of the hole 105a is flattened.

With the circuit board 212 oil the present embodiment, similarly as in Embodiment 6, electronic parts (not shown) are mounted onto one or both surfaces of the circuit board 212; a plastic material is then placed thereon similarly as in Embodiment 1 or a buffer sheet is placed thereon similarly as in Embodiment 4 so as to protect the mounted electronic parts; and a second sheet and third sheet are then adhered respectively to further outside of the two surfaces to construct a noncontacting IC card.

In the circuit board constructed as described above, the reliability of its electric conduction is improved, since: the rear end of the Al rod 110 has a larger diameter than the hole diameter; the Al rod 110 has a length longer than the depth of the hole 105*a*; and the portion extended to the outside of the hole 105*a* is flattened.

What is claimed is:

1. A non-contact IC card comprising:
    a resin sheet having opposed first and second surfaces and side surfaces transverse to the first and second surfaces, the first surface defining a first outer surface of the IC card;
    a conductive circuit pattern on the second surface of the resin sheet;
    electronic parts mounted on the conductive circuit pattern;
    an electrically insulating filling resin covering and filling gaps between the conductive circuit pattern and the electronic parts; and
    an electrically insulating plastic material disposed opposite the second surface of the resin sheet, covering and contacting the electrically insulating filling resin, and continuously extending onto and covering side surfaces of the filling resin and the side surfaces of the resin sheet.

2. The non-contact IC card according to claim 1 including an electrically conductive adhesive bonding the electronic parts to the conductive circuit pattern.

* * * * *